United States Patent [19]
Klingbeil, Jr. et al.

[11] Patent Number: 5,830,774
[45] Date of Patent: Nov. 3, 1998

[54] METHOD FOR FORMING A METAL PATTERN ON A SUBSTRATE

[75] Inventors: Lawrence S. Klingbeil, Jr., Chandler; Marino J. Martinez; Ernest Schirmann, both of Phoenix; Gordon M. Grivna, Mesa, all of Ariz.

[73] Assignee: Motorola, Inc., Schaumburg, Ill.

[21] Appl. No.: 667,013

[22] Filed: Jun. 24, 1996

[51] Int. Cl.⁶ .......................... H01L 21/44; H01L 21/441
[52] U.S. Cl. .......................... 437/203; 437/184; 437/195; 437/238; 437/241; 437/978; 437/981; 156/653.1
[58] Field of Search .......................... 156/653.1; 437/184, 437/195, 203, 228, 235, 238, 241, 944, 978, 981

[56] References Cited

U.S. PATENT DOCUMENTS

| | | | |
|---|---|---|---|
| 4,495,220 | 1/1985 | Wolf et al. | 437/195 |
| 4,843,024 | 6/1989 | Ito | 437/41 |
| 5,007,873 | 4/1991 | Goronkin et al. | 437/203 |
| 5,008,216 | 4/1991 | Huang et al. | |
| 5,422,294 | 6/1995 | Noble, Jr. | 437/203 |
| 5,434,451 | 7/1995 | Dalal et al. | |
| 5,512,518 | 4/1996 | Cho et al. | 437/978 |

FOREIGN PATENT DOCUMENTS

| | | | |
|---|---|---|---|
| 58-166725 | 10/1983 | Japan | 156/653.1 |
| 01-021940 | 1/1989 | Japan | 437/203 |
| 01-209726 | 8/1989 | Japan | 437/184 |
| 03-110835 | 5/1991 | Japan | 437/944 |
| 05-211172 | 8/1993 | Japan | |

OTHER PUBLICATIONS

Dalal et al., "Methods of opening contact holes in oxide–nitride structure", IBM Tech. Disc. bull., vol.24, No.9, pp. 4728–4729, Feb. 1, 1982.

Wolf & Tauber, Silicon Processing for the VLSI Era: vol. 1—Process Technolgoy, pp. 335 & 532–534, 1986.

*Primary Examiner*—John Niebling
*Assistant Examiner*—Kevin F. Turner
*Attorney, Agent, or Firm*—Ziye Zhou; Bruce T. Neel

[57] ABSTRACT

A method for forming a metal pattern on a substrate (11) includes forming a dielectric stack (14) on a major surface (12) of the substrate (11) and forming a mask (22) on the dielectric stack (14). The dielectric stack (14) includes an aluminum nitride layer (16) serving as an etch stop layer between two dielectric layers (15, 17). An opening is formed in the dielectric stack (14) via successive etching. The etching of the dielectric layer (15) between the aluminum nitride layer (16) and the substrate (11) undercuts the aluminum nitride layer (16). A metal layer (30) is deposited on the major surface through the opening via sputtering. The metal layer (30) on the major surface is distinctively separated from a metal layer (34) on the edge of the opening. The mask (22) is dissolved in a solvent, thereby lifting-off a metal layer (34) deposited on the mask (22).

20 Claims, 4 Drawing Sheets

METHOD FOR FORMING A METAL PATTERN ON A SUBSTRATE

BACKGROUND OF THE INVENTION

The present invention relates, in general, to forming a metal pattern on a substrate and, more particularly, to forming a metal pattern on a substrate via a metal deposition and lift-off process.

In integrated circuits, a metal pattern is widely used to form an ohmic contact to an electrode of a semiconductor device or to form an interconnect between two electronic components of the integrated circuit. In forming a metal pattern, metals are deposited on the surface of a semiconductor substrate via an evaporation process or a sputtering process. The sputtering process is suitable for depositing a refractory metal which has a relatively high melting temperature.

In a typical dielectric-assisted lift-off process to form a metal pattern on the surface of the semiconductor substrate, a first dielectric layer such as, for example, a silicon nitride layer, is formed on the substrate surface and a second dielectric layer such as, for example, a silicon oxide layer, is formed on the first dielectric layer. A photoresist mask is used to pattern the dielectric layers. The two dielectric layers are etched to form an opening in the dielectric layers, thereby exposing a region on the substrate surface where the metal pattern is to be formed. The photoresist mask and two dielectric layers form a stencil which defines the pattern of the metal layer on the substrate surface. Metal is sputtered and deposited on the substrate surface in the exposed region to form the metal pattern. Metal is also deposited on the stencil. The metal on the photoresist mask is removed or lifted off from the substrate by dissolving the photoresist mask in a solvent.

However, there are a few disadvantages in the dielectric-assisted lift-off process. First, the undercut of the second dielectric layer is usually not optimal for sputtered metal deposition. Thus, the metal deposited on the stencil is sometimes connected to the metal deposited on the substrate surface. The connection between the metal on the stencil and the metal on the substrate surface usually results in an incomplete lift-off of the metal on the stencil. Second, in some applications, the second dielectric layer is etched away after the photoresist mask is lifted off. When the second dielectric layer is etched away, the metal deposited on the edge of the opening in the dielectric layers sometimes breaks free and becomes metal fragments scattered across the substrate surface. Third, it is difficult to integrate the dielectric-assisted lift-off process with existing semiconductor processes.

Accordingly, it would be advantageous to have a method for forming a metal pattern on a substrate via a metal deposition and lift-off process. It is desirable for the method to have a complete lift-off of the metal on the stencil. It is also desirable that no metal fragment is produced during the process. It would be of further advantage for the process to be simple and easily integrated with existing semiconductor processes.

DETAILED DESCRIPTION OF THE DRAWINGS

Generally, the present invention provides a method for forming a metal pattern on a substrate via a metal deposition and lift-off process. A unique feature of the present invention is an etch stop layer in a dielectric stack. The etch stop layer creates a shadow in the dielectric stack. When metal is deposited on the substrate, the shadow results in a distinct break between the metal deposited on the substrate and the metal deposited on the dielectric stack.

Figure 1:
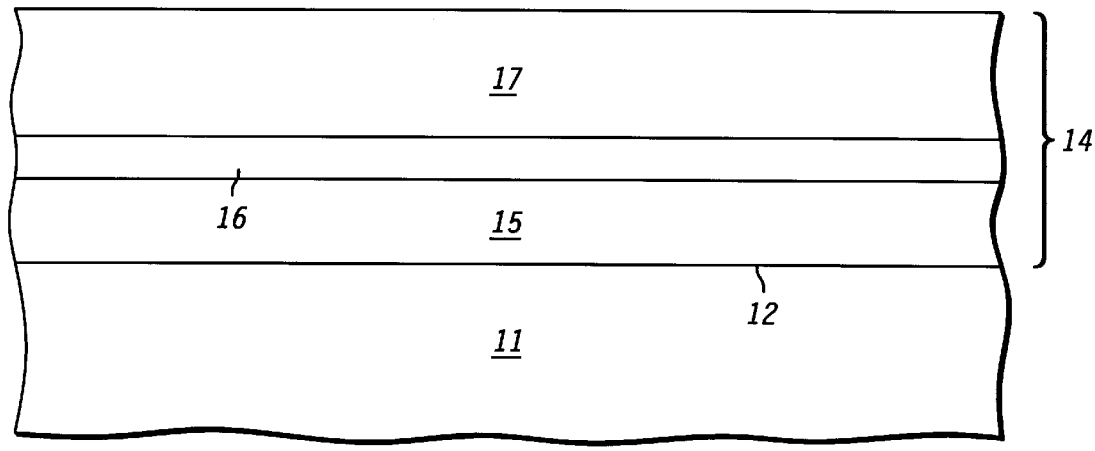
FIGS. 1–7 are enlarged cross-sectional views of a structure at various stages of forming a metal pattern on a substrate in accordance with the present invention.

FIG. 1 is an enlarged cross-sectional view of a structure 10 at an early stage of forming a metal pattern on a substrate 11 in accordance with the present invention. By way of example, substrate 11 is a gallium arsenide semiconductor substrate. Substrate 11 has a major surface 12. A dielectric stack 14 is formed on major surface 12. A first dielectric layer 15 such as, for example, a silicon nitride layer, of dielectric stack 14 is formed on major surface 12. Preferably, dielectric layer 15 is thicker than a metal layer to be formed on major surface 12 in a subsequent step of forming the metal pattern. A second dielectric layer 16 such as, for example, an aluminum nitride layer, of dielectric stack 14 is formed on dielectric layer 15 and serves as an etch stop layer. A third dielectric layer 17 such as, for example, a silicon oxide layer, of dielectric stack 14 is formed on etch stop layer 16. Dielectric layers 15, 16, and 17 can be formed using techniques such as, for example, plasma enhanced chemical vapor deposition, which are well known in the art. In an embodiment of the present invention, aluminum nitride layer 16 is formed via a reactive sputtering process using a direct current magnetron with argon and nitrogen gasses flowing toward an aluminum target. The ratio of the gas flow rate of the argon to the gas flow rate of the nitrogen is, for example, approximately four to one.

It should be noted that substrate 11 is not limited to being a gallium arsenide semiconductor substrate. The method of the present invention is applicable to many types of substrate. For example, a silicon semiconductor substrate is another widely used substrate in semiconductor industry on which a metal pattern may be formed in accordance with the present invention.

It should also be noted that dielectric layers 15, 16, and 17 are not limited to being silicon nitride, aluminum nitride, and silicon oxide layers, respectively, as describe hereinbefore. When substrate 11 is a gallium arsenide semiconductor substrate, dielectric layer 15 is preferably a silicon nitride layer deposited on major surface 12. When substrate 11 is a silicon semiconductor substrate, dielectric layer 15 is preferably a silicon oxide layer formed on major surface 12 via oxidation. Etch stop layer 16 is preferably highly selective to an etchant to which dielectric layer 15 is susceptible. Commonly used etchants for etching silicon nitride and silicon oxide include fluorine containing etchants in dry etching processes and buffered hydrofluoric acid in wet etching processes. Aluminum nitride is highly selective to these etchants. Therefore, an aluminum nitride layer is a candidate for etch stop layer 16. Dielectric layer 17 can be formed from any dielectric material, e.g., silicon oxide, silicon nitride, etc., which is susceptible to an etchant to which etch stop layer 16 is highly selective.

Furthermore, dielectric stack 14 is not limited to including three dielectric layers as shown in FIG. 1. In accordance with the present invention, dielectric stack 14 preferably includes at least two dielectric layers such as dielectric layer 15 and etch stop layer 16. In other words, dielectric layer 17 is optional in forming a metal pattern on major surface 12. On the other hand, dielectric stack 14 may include four or more dielectric layers, of which at least one dielectric layer preferably serves as an etch stop layer.

Figure 2:
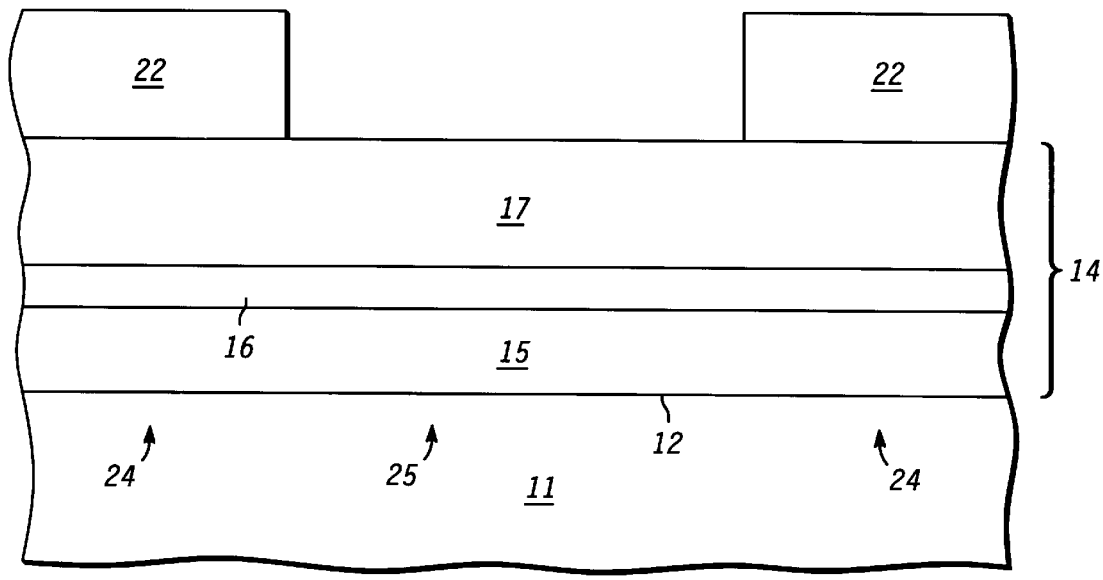

FIG. 2 is an enlarged cross-sectional view of structure 10 at a subsequent stage of forming the metal pattern on substrate 11 in accordance with the present invention. It should be noted that the same reference numbers are used in the figures to represent the same elements. A masking layer 22 such as, for example, a photoresist layer, is formed on dielectric layer 17. Masking layer 22 is patterned to cover and protect dielectric layer 17 over portions 24 of major surface 12. Masking layer 22 is absent from a portion 25 of major surface 12 adjacent portions 24. In a subsequent step, a metal layer will be deposited on portion 25 of major surface 12. Techniques for patterning photoresist masking layer 22 are well known to those skilled in the art. Preferably, photoresist masking layer 22 is hard baked at a temperature of, for example, approximately one hundred and twenty degrees Celsius, for a time duration of, for example, approximately two minutes. Hard baked photoresist masking layer is less susceptible to the etchant such as ammonium hydroxide used in etching aluminum nitride layer 16.

Figure 3:
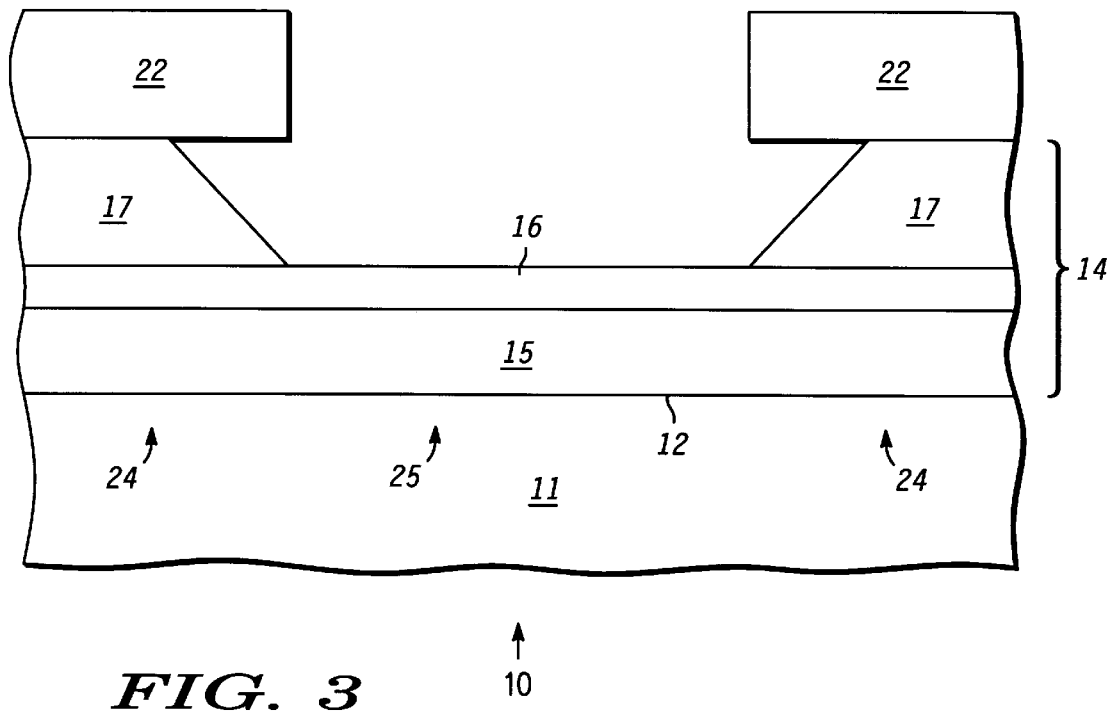

Referring now to FIG. 3, a portion of dielectric layer 17 which is not covered or protected by masking layer 22 is removed in an etching process, thereby forming an opening in dielectric layer 17 and exposing a portion of aluminum nitride layer 16 that overlies portion 25 of major surface 12. Etching dielectric layer 17 also undercuts photoresist masking layer 22. The etchant used in the etching process preferably has a higher etch selectivity to aluminum nitride than to silicon oxide. By way of example, dielectric layer 17 is etched in a wet etching process using buffered hydrofluoric acid as the etchant. In an alternative embodiment, dielectric layer 17 is etched in a reactive ion etching process using a fluorine containing gas as the etchant. Aluminum nitride is highly selective to both hydrofluoric acid and fluorine containing gas.

Figure 4:
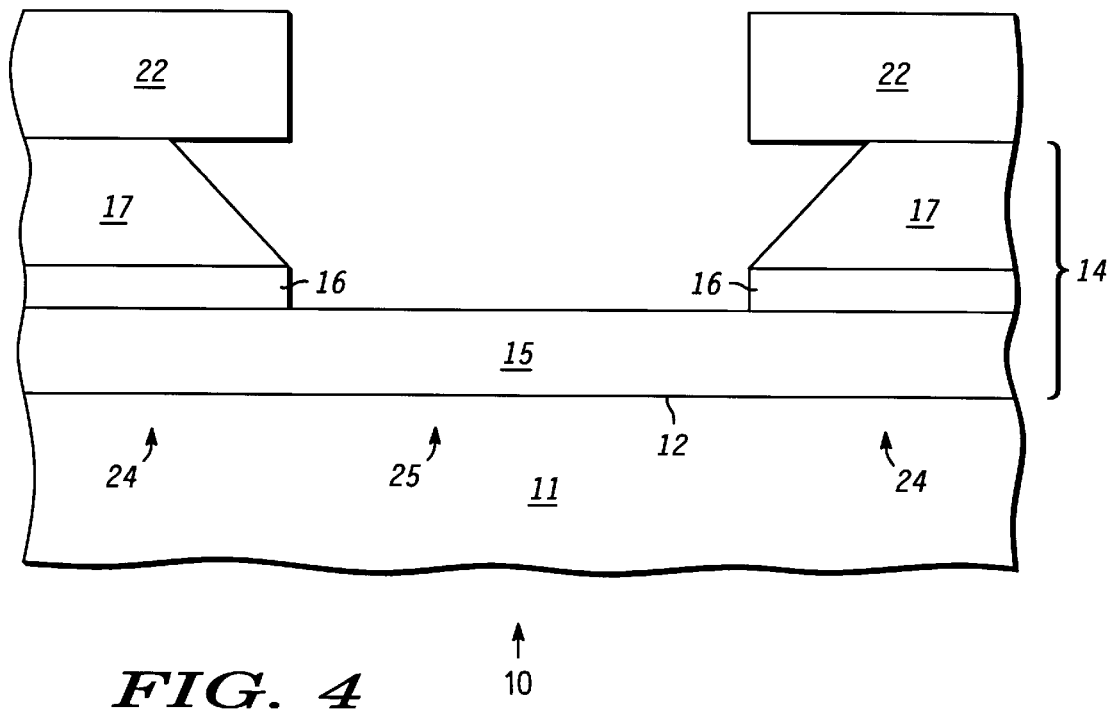

FIG. 4 is an enlarged cross-sectional view of structure 10 at a subsequent stage of forming the metal pattern on substrate 11 in accordance with the present invention. A portion of aluminum nitride layer 16 that is unprotected by dielectric layer 17 is etched away using an etchant such as, for example, ammonium hydroxide, phosphoric acid, etc. The etching process forms an opening in aluminum nitride layer 16 which overlaps the opening in dielectric layer 17 and exposes a portion of dielectric layer 15. Preferably, the etchant used to etch aluminum nitride layer 16 has a higher etch selectivity to silicon oxide and silicon nitride than to aluminum nitride.

Figure 5:
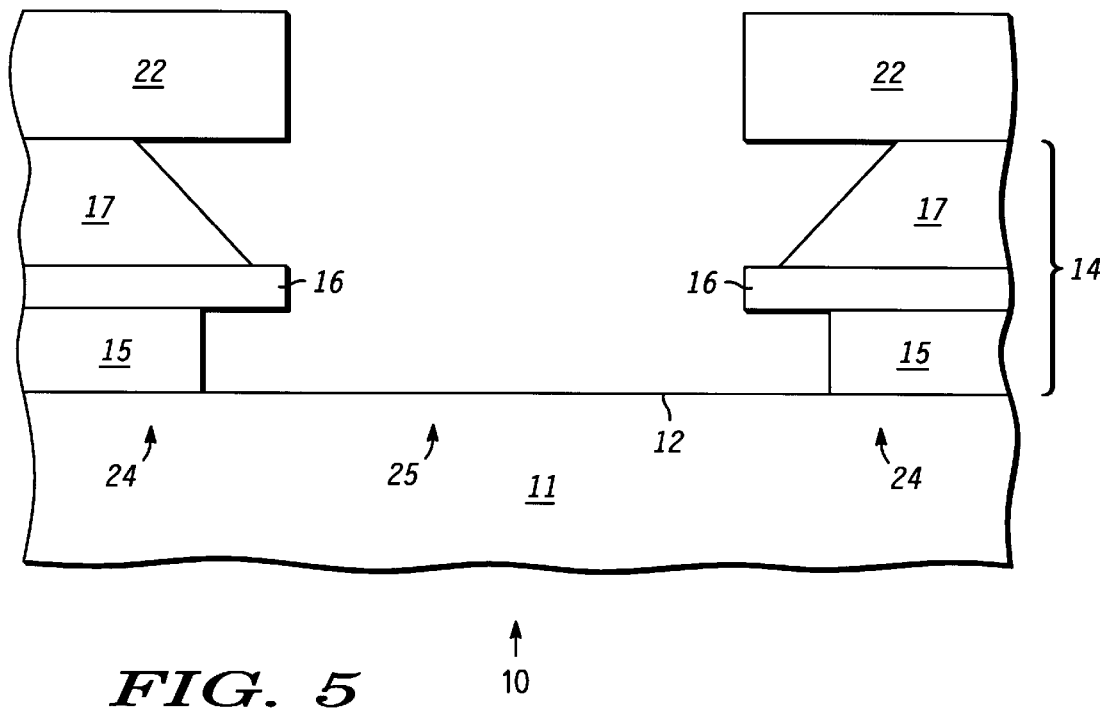

Referring now to FIG. 5, a portion of dielectric layer 15 which is not protected by aluminum nitride layer 16 is removed in an etching process, thereby forming an opening in dielectric layer 15 and exposing portion 25 of major surface 12. The etchant used in the etching process preferably has a higher etch selectivity to aluminum nitride than to silicon nitride. By way of example, dielectric layer 15 is etched in a reactive ion etching process using a fluorine containing gas as the etchant. In an alternative embodiment, dielectric layer 15 is etched in a wet etching process using buffered hydrofluoric acid as the etchant. Aluminum nitride is highly selective to both fluorine containing gas and hydrofluoric acid.

The etching process undercuts aluminum nitride layer 16. In other words, the opening in dielectric layer 15 formed in the etching process overlaps and is larger than the opening in aluminum nitride layer 16. The undercut of aluminum layer 16 creates a shadow of dielectric stack 14 on major surface 12. The etching process also partially consumes dielectric layer 17. Thus, the opening in dielectric layer 17 after etching dielectric layer 15 (FIG. 5) is larger than the opening in dielectric layer 17 before etching dielectric layer 15 (FIGS. 3 and 4).

Figure 6:
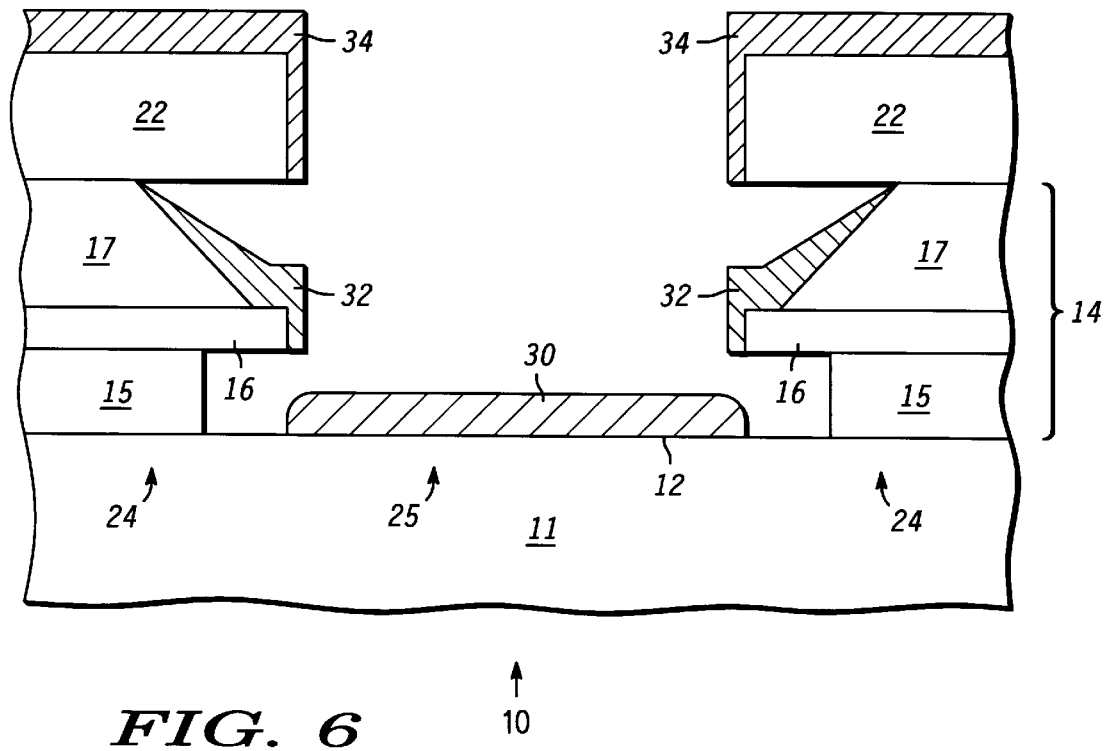

Referring now to FIG. 6, a metal layer 30 is deposited on portion 25 of major surface 12. By way of example, metal layer 30 is formed by sputtering metal to substrate 11. During the sputtering process, photoresist masking layer 22 and dielectric stack 14 serve as a stencil for forming a metal pattern on major surface 12 of substrate 11. Thus, metal is also sputtered on the edge of the openings in dielectric stack 14 to form a metal layer 32 and sputtered on photoresist masking layer 22 to form a metal layer 34. According to the present invention, there is a distinct break between metal layer 30 on major surface 12 and metal layer 32 on the edge of dielectric stack 14 because dielectric stack 14 projects a shadow on major surface 12 and dielectric layer 15 is thicker than metal layer 30. It should be understood that metal layer 30 is not limited to being a single layer. Depending on the process, any number of metal layers such as, for example, two, three, four, etc., may be deposited on major surface 12 via successive sputtering processes.

Figure 7:
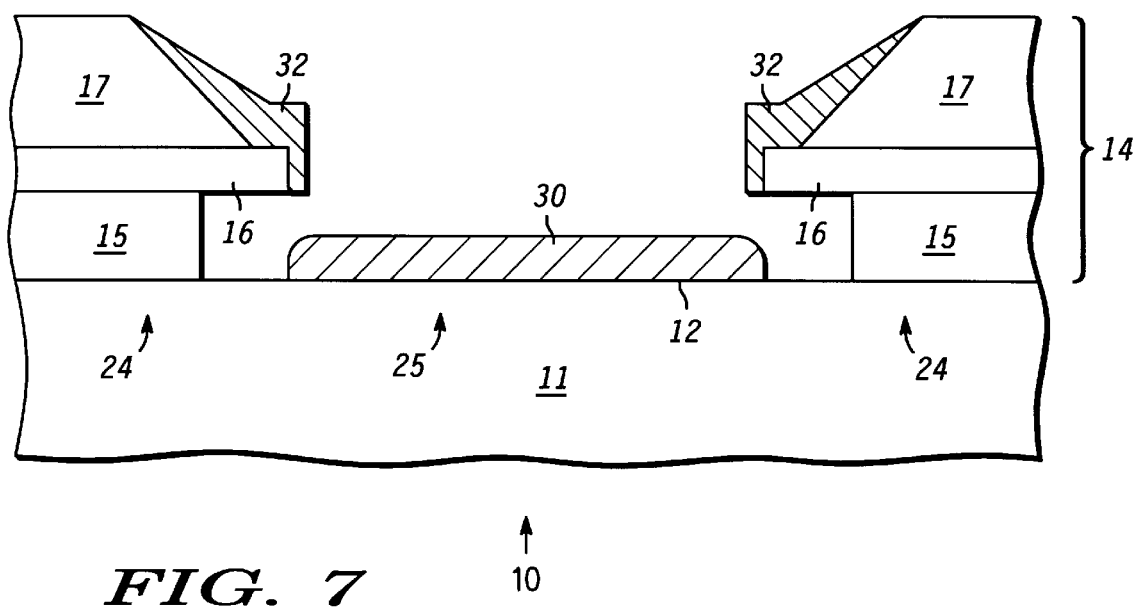

Referring now to FIG. 7, substrate 11 is immersed in a solvent such as, for example, acetone, to dissolve photoresist masking layer 22 of FIG. 6. When photoresist masking layer 22 is removed from structure 10, metal layer 34 deposited on photoresist masking layer 22 of FIG. 6 is also removed or lifted off from structure 10. Structure 10 now includes metal layer 30 on major surface 12 and metal layer 32 on the edge of the opening in dielectric stack 14, wherein metal layer 32 is distinctively separated from metal layer 30. The pattern of the opening in dielectric stack 14 determines the pattern of metal layer 30 on substrate 11. Structure 10 is ready for subsequent semiconductor device fabrication processes. Furthermore, a new metal pattern may be formed in a different portion of major surface 12 by forming and patterning a new photoresist masking layer on dielectric layer 17.

By now it should be appreciated that a method for forming a metal pattern on a substrate via a metal deposition and lift-off process has been provided. In accordance with the present invention, an undercut of the etch stop layer results in a distinct break between the metal layer of the surface of the substrate and the metal layer on the stencil. Thus, the metal pattern is easily controllable via patterning the stencil. Further, the lift-off of the metal on the photoresist masking layer is complete when the photoresist masking layer is removed. After forming the metal pattern, the dielectric stack remains to support the metal layer on the edge of the dielectric stack, thereby preventing metal fragments from being produced and scattered across the substrate. The metal pattern formation process of the present invention is simple and can be easily integrated with existing semiconductor processes.

While specific embodiments of the present invention have been shown and described, further modifications and improvements will occur to those skilled in the art. It is understood that the present invention is not limited to the particular forms shown and it is intended for the appended claims to cover all modifications of the invention which fall within the true spirit and scope of the invention. For example, the metal layer may be deposited on the substrate via an evaporation process.

We claim:

1. A method for forming a metal pattern on a substrate having a major surface, comprising the steps of:

forming a first dielectric layer over the major surface;

forming a dielectric etch stop layer on the first dielectric layer;

forming a masking layer over the dielectric etch stop layer, the masking layer overlying a first portion of the major surface of the substrate;

etching away a portion of the dielectric etch stop layer that is unprotected by the masking layer, thereby forming an opening in the dielectric etch stop layer;

forming an opening in the first dielectric layer, the opening in the first dielectric layer being larger than the opening in the dielectric etch stop layer; and depositing a metal layer on a second portion of the major surface of the substrate through the opening in the dielectric etch stop layer and the opening in the first dielectric layer.

2. The method of claim 1, wherein said step of forming a dielectric etch stop layer includes forming an aluminum nitride layer.

3. The method of claim 1, wherein said step of etching away a portion of the dielectric etch stop layer includes using an etchant that has a higher etch selectivity to the first dielectric layer than to the dielectric etch stop layer.

4. The method of claim 1, wherein said step of forming an opening in the first dielectric layer includes etching away a portion of the first dielectric layer through the opening in the dielectric etch stop layer using an etchant that has a higher etch selectivity to the dielectric etch stop layer than to the first dielectric layer.

5. The method of claim 1, further comprising the steps of:
forming a second dielectric layer on the dielectric etch stop layer before said step of forming a masking layer; and etching away a portion of the second dielectric layer that is unprotected by the masking layer using an etchant that has a higher etch selectivity to the dielectric etch stop layer than to the second dielectric layer.

6. The method of claim 1, wherein said step of depositing a metal layer includes sputtering metal to form the metal layer.

7. The method of claim 1, further comprising the step of removing the masking layer after said step of depositing a metal layer.

8. A method for forming a metal pattern on a substrate, comprising the steps of:

providing the substrate having a major surface;

forming a first dielectric layer over the major surface;

forming an aluminum nitride layer on the first dielectric layer;

forming a second dielectric layer on the aluminum nitride layer;

forming a masking layer on the second dielectric layer, the masking layer overlying a first portion of the major surface of the substrate;

etching away a portion of the second dielectric layer that is unprotected by the masking layer, thereby forming an opening in the second dielectric layer;

forming an opening in the aluminum nitride layer, the opening in the aluminum nitride layer overlapping the opening in the second dielectric layer;

forming an opening in the first dielectric layer overlapping the opening in the aluminum nitride layer, the opening in the first dielectric layer being larger than the opening in the aluminum nitride layer;

depositing a metal layer on a second portion of the major surface of the substrate through the opening in the aluminum nitride layer; and removing the masking layer.

9. The method of claim 8, wherein said step of providing the substrate includes providing a gallium arsenide semiconductor substrate and said step of forming a first dielectric layer includes depositing a silicon nitride layer on the major surface.

10. The method of claim 8, wherein said step of providing the substrate includes providing a silicon semiconductor substrate and said step of forming a first dielectric layer includes forming a silicon oxide layer on the major surface.

11. The method of claim 8, wherein said step of forming a second dielectric layer includes depositing a silicon oxide layer on the aluminum nitride layer.

12. The method of claim 8, wherein said step of etching away a portion of the second dielectric layer and said step of forming an opening in the first dielectric layer further include using a fluorine containing etchant.

13. The method of claim 8, wherein said step of forming an opening in the aluminum nitride layer includes etching away a portion of the aluminum nitride layer through the opening in the second dielectric layer using ammonium hydroxide.

14. The method of claim 8, wherein said step of forming a masking layer includes forming a photoresist layer.

15. The method of claim 14, wherein said step of removing the masking layer includes dissolving the photoresist layer in a solvent.

16. The method of claim 8, wherein said step of depositing a metal layer includes sputtering metal to form the metal layer.

17. A method for forming a metal pattern on a substrate, comprising the steps of:

forming a first dielectric layer over a major surface of the substrate;

forming an aluminum nitride layer on the first dielectric layer;

forming a second dielectric layer on the aluminum nitride layer;

forming a photoresist layer on the second dielectric layer, the photoresist layer being patterned to overlie a first portion of the major surface of the substrate;

etching away a portion of the second dielectric layer that is unprotected by the photoresist layer, thereby forming an opening in the second dielectric layer;

forming an opening in the aluminum nitride layer overlapping the opening in the second dielectric layer;

forming an opening in the first dielectric layer overlapping the opening in the aluminum nitride layer, the opening in the first dielectric layer being larger than the opening in the aluminum nitride layer;

sputtering a metal layer on a second portion of the major surface of the substrate through the opening in the aluminum nitride layer; and using a solvent to dissolve the photoresist layer.

18. The method of claim 17, wherein said step of etching away a portion of the second dielectric layer further includes using buffered hydrofluoric acid.

19. The method of claim 17, wherein said step of forming an opening in the aluminum nitride layer includes etching away a portion of the aluminum nitride layer through the opening in the second dielectric layer using phosphoric acid.

20. The method of claim 17, wherein said step of using a solvent to dissolve the photoresist layer includes using acetone as the solvent.

* * * * *